United States Patent
Kang et al.

(10) Patent No.: US 10,971,825 B2
(45) Date of Patent: Apr. 6, 2021

(54) ANTENNA MODULE AND METHOD OF MANUFACTURING THE SAME

(71) Applicant: Samsung Electro-Mechanics Co., Ltd., Suwon-si (KR)

(72) Inventors: Ho Kyung Kang, Suwon-si (KR); ThomasA Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 264 days.

(21) Appl. No.: 15/994,514

(22) Filed: May 31, 2018

(65) Prior Publication Data

US 2019/0036232 A1 Jan. 31, 2019

(30) Foreign Application Priority Data

Jul. 28, 2017 (KR) .......................... 10-2017-0096349
Sep. 22, 2017 (KR) .......................... 10-2017-0122447

(51) Int. Cl.
*H01Q 1/22* (2006.01)
*H01Q 21/06* (2006.01)
(Continued)

(52) U.S. Cl.
CPC .......... *H01Q 21/065* (2013.01); *H01L 21/481* (2013.01); *H01L 21/486* (2013.01);
(Continued)

(58) Field of Classification Search
CPC .......... H01Q 1/2283; H01Q 1/38; H01Q 1/52; H01Q 9/0407–0414; H01Q 21/065;
(Continued)

(56) References Cited

U.S. PATENT DOCUMENTS 6,114,997 A 9/2000 Lee et al.
8,901,688 B2 * 12/2014 Kamgaing ......... H01Q 21/0087
257/428

(Continued)

FOREIGN PATENT DOCUMENTS

CN 1595649 A 3/2005
CN 103392261 A 11/2013
(Continued)

OTHER PUBLICATIONS

Chinese Office Action dated Jan. 17, 2020 in related Chinese Patent Application No. 201810831914.0 (11 pages in English, 9 pages in Chinese).

*Primary Examiner* — Hasan Z Islam
(74) *Attorney, Agent, or Firm* — NSIP Law

(57) ABSTRACT

An antenna module includes: an integrated circuit (IC) configured to generate a radio frequency (RF) signal; and a substrate including an antenna portion providing a first surface of the substrate, and a circuit pattern portion providing a second surface of the substrate. The antenna portion includes first antenna members configured to transmit the RF signal, cavities corresponding to the first antenna members, through vias respectively disposed in the cavities and respectively electrically connected to the first antenna members, and a plating member disposed in at least one cavity among the cavities. The circuit pattern portion includes a circuit pattern and an insulating layer forming, for each of the through vias, an electrical connection path to the IC.

19 Claims, 9 Drawing Sheets

(51) Int. Cl.
*H01Q 1/38* (2006.01)
*H01L 23/498* (2006.01)
*H01L 23/13* (2006.01)
*H01L 23/552* (2006.01)
*H01L 23/66* (2006.01)
*H01L 21/48* (2006.01)
*H01L 23/00* (2006.01)
*H01L 21/56* (2006.01)
*H01L 23/31* (2006.01)
*H01Q 9/04* (2006.01)
*H01Q 1/52* (2006.01)
*H01L 21/683* (2006.01)
*H01L 25/16* (2006.01)
*H01L 23/50* (2006.01)

(52) U.S. Cl.
CPC .......... *H01L 21/4857* (2013.01); *H01L 21/56* (2013.01); *H01L 21/6835* (2013.01); *H01L 23/13* (2013.01); *H01L 23/3121* (2013.01); *H01L 23/49827* (2013.01); *H01L 23/49833* (2013.01); *H01L 23/49838* (2013.01); *H01L 23/552* (2013.01); *H01L 23/66* (2013.01); *H01L 24/16* (2013.01); *H01L 24/81* (2013.01); *H01Q 1/2283* (2013.01); *H01Q 1/38* (2013.01); *H01Q 1/523* (2013.01); *H01Q 9/0407* (2013.01); *H01Q 9/0414* (2013.01); H01L 23/49816 (2013.01); H01L 23/50 (2013.01); H01L 25/16 (2013.01); H01L 2221/68345 (2013.01); H01L 2223/6616 (2013.01); H01L 2223/6677 (2013.01); H01L 2223/6683 (2013.01); H01L 2224/16227 (2013.01); H01L 2224/32225 (2013.01); H01L 2224/73204 (2013.01); H01L 2924/1421 (2013.01); H01L 2924/1423 (2013.01); H01L 2924/15192 (2013.01); H01L 2924/15321 (2013.01); H01L 2924/16152 (2013.01); H01L 2924/181 (2013.01); H01L 2924/19041 (2013.01); H01L 2924/19042 (2013.01); H01L 2924/19105 (2013.01); H01L 2924/3025 (2013.01)

(58) Field of Classification Search
CPC .... H05K 1/18; G06K 19/07; H01L 21/50–56; H01L 23/66
See application file for complete search history.

(56) References Cited

U.S. PATENT DOCUMENTS

| 9,153,863 | B2* | 10/2015 | Nair | H01Q 1/38 |
| 2005/0088260 | A1 | 4/2005 | Ajioka et al. | |
| 2012/0280860 | A1* | 11/2012 | Kamgaing | H01Q 3/30 |
| | | | | 342/368 |
| 2013/0141284 | A1* | 6/2013 | Jeong | H01Q 1/2283 |
| | | | | 343/700 MS |
| 2013/0189935 | A1* | 7/2013 | Nair | H01Q 1/2283 |
| | | | | 455/90.2 |
| 2013/0223034 | A1* | 8/2013 | Rathburn | H05K 1/115 |
| | | | | 361/767 |
| 2014/0063754 | A1 | 3/2014 | Jünemann et al. | |
| 2014/0168014 | A1* | 6/2014 | Chih | H01L 24/19 |
| | | | | 343/700 MS |
| 2015/0130681 | A1* | 5/2015 | Hsieh | H01Q 1/362 |
| | | | | 343/895 |
| 2015/0279789 | A1* | 10/2015 | Mahajan | H01L 24/16 |
| | | | | 257/659 |
| 2017/0222316 | A1* | 8/2017 | Mizunuma | H01Q 21/062 |

FOREIGN PATENT DOCUMENTS

| CN | 103782448 A | 5/2014 |
| JP | 2009-38696 A | 2/2009 |
| KR | 10-2014-0005339 A | 1/2014 |
| WO | WO 2012/151123 A9 | 11/2012 |

* cited by examiner

ANTENNA MODULE AND METHOD OF MANUFACTURING THE SAME

CROSS-REFERENCE TO RELATED APPLICATIONS

This application claims the benefit under 35 U.S.C. § 119(a) of Korean Patent Application Nos. 10-2017-0096349 and 10-2017-0122447 filed on Jul. 28, 2017 and Sep. 22, 2017, respectively, in the Korean Intellectual Property Office, the entire disclosures of which are incorporated herein by reference for all purposes.

BACKGROUND

1. Field

The following description relates to an antenna module and a method of manufacturing an antenna module.

2. Description of Related Art

Recently, research has been conducted on millimeter wave (mmWave) communications, including fifth generation (5G) communications. Additionally, research has recently been conducted on an antenna module that is capable of implementing millimeter wave (mmWave) communications with suitable performance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna module includes: an integrated circuit (IC) configured to generate a radio frequency (RF) signal; and a substrate including an antenna portion providing a first surface of the substrate, and a circuit pattern portion providing a second surface of the substrate. The antenna portion includes first antenna members configured to transmit the RF signal, cavities corresponding to the first antenna members, through vias respectively disposed in the cavities and respectively electrically connected to the first antenna members, and a plating member disposed in at least one cavity among the cavities. The circuit pattern portion includes a circuit pattern and an insulating layer forming, for each of the through vias, an electrical connection path to the IC.

The antenna portion may further include an insulating member at least partially two-dimensionally surrounding each of the cavities. A thickness of the insulating member may be greater than a thickness of the insulating layer.

The through vias may form linear connections between the circuit pattern portion and corresponding first antenna members among the first antenna members.

The plating member may two-dimensionally surround each of the cavities.

The antenna portion may further include shielding vias at least partially two-dimensionally surrounding each of the cavities and the plating member.

The antenna module may further include: a dielectric member disposed in at least some of the cavities and at least partially two-dimensionally surrounding corresponding through vias among the through vias, wherein a dielectric constant of the dielectric member is different from a dielectric constant of the insulating layer.

A dielectric dissipation factor (Df) of the dielectric member may be lower than a Df of the insulating layer, and a specific dielectric constant (Dk) of the dielectric member may be lower than a Dk of the insulating layer.

The first antenna members may be disposed in the corresponding cavities, and the antenna portion may further include second antenna members corresponding to the first antenna members, and an encapsulation member at least partially two-dimensionally surrounding the second antenna members and forming the first surface.

The IC may be configured to convert a signal received through a connector or a receiving port disposed on the second surface into the RF signal in a millimeter wave (mmWave) band.

In another general aspect, a method to manufacture an antenna module includes: cutting a portion including an insulating member and cavities formed in the insulating member; plating the insulating member; forming first antenna members and through vias in the cavities; adhering the insulating member to a circuit pattern portion including a circuit pattern; and disposing an integrated circuit (IC) on a surface of the circuit pattern portion.

The method may further include compressing an encapsulation member and second antenna members together on the insulating member.

The forming of the first antenna members and the through vias may include forming the through vias to be connected to respective first antennas among the first antennas. The adhering of the insulating member to the circuit pattern portion may include disposing the insulating member such that the through vias are connected to the circuit pattern.

The disposing of the IC on the surface the circuit pattern portion may include connecting the IC to the circuit pattern.

The method may further include disposing dielectric members in the cavities such that the dielectric layers are penetrated by respective through vias, among the through vias.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
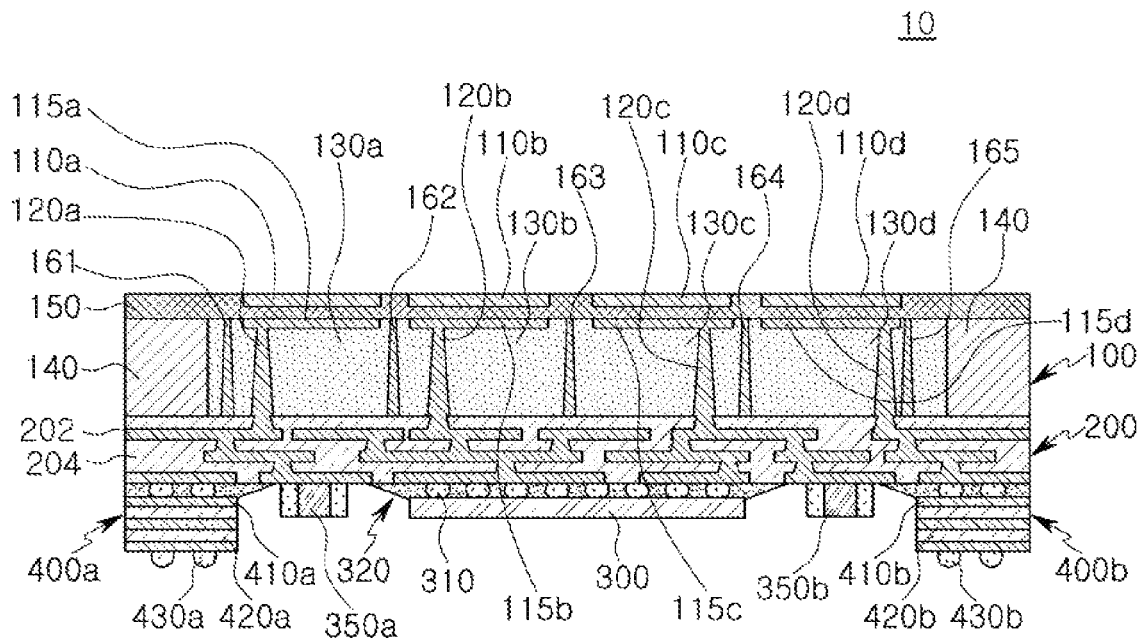
FIG. 1 is a diagram illustrating an antenna module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating an antenna module 10, according to an embodiment.

Referring to FIG. 1, a substrate of the antenna module 10 has a heterogeneous structure including an antenna region or antenna portion 100 and a circuit pattern region or circuit pattern portion 200. The antenna region (or portion) 100 has a structure that facilitates improving antenna performance, and the circuit pattern region 200 has a structure in which at least one circuit pattern 202 and at least one insulating layer 204 are disposed. The antenna portion 100 is disposed on the circuit pattern portion 200.

Referring to FIG. 1, the antenna portion 100 includes cavities each including at least some of first antenna members 115a, 115b, 115c and 115d, through vias 120a, 120b, 120c and 120d, dielectric members 130a, 130b, 130c and 130d, plating members 161 and 165, and shield vias 162, 163, and 164, and at least some of second antenna members 110a, 110b, 110c, and 110d, an insulating member 140, and a encapsulation member 150.

The second antenna members 110a, 110b, 110c, and 110d are disposed adjacent to or on a first surface (upper surface in FIG. 1) of the antenna module 10 and receive radio frequency (RF) signals or transmit RF signals generated from an integrated circuit (IC) 300. That is, second antenna members 110a, 110b, 110c, and 110d are disposed on an upper surface of the antenna portion 100.

The first antenna members 115a, 115b, 115c, and 115d are electromagnetically coupled to corresponding second antenna members 110a, 110b, 110c, and 110d to transmit the RF signals to the corresponding second antenna members or receive the RF signals from the corresponding second antenna members.

For example, the first antenna members 115a, 115b, 115c, and 115d may have a shape similar to that of the corresponding second antenna members, and improve antenna performance such as directivity of the corresponding second antenna member adjacent to the corresponding second antenna member.

Depending on the design, one of the second antenna members 110a, 110b, 110c, and 110d and the first antenna members 115a, 115b, 115c, and 115d may be omitted. In addition, the antenna portion 100 may further include additional antenna members corresponding to the second antenna members 110a, 110b, 110c, and 110d, respectively.

The through vias 120a, 120b, 120c, and 120d may be electrically connected to the corresponding first antenna members to provide paths for the RF signals. The through vias 120a, 120b, 120c, and 120d may extend as much as a length longer than a thickness of each insulating layer of the circuit pattern portion 200. Accordingly, the transmission efficiency of the RF signals may be improved.

The dielectric members 130a, 130b, 130c, and 130d are penetrated by the corresponding through vias 120a, 120b, 120c, and 120d and may surround the corresponding through vias 120a, 120b, 120c, and 120d. The dielectric members 130a, 130b, 130c, and 130d are disposed on an upper surface of the circuit pattern portion 200. The dielectric members 130a, 130b, 130c, and 130d may have a thickness greater than a thickness of each insulating layer 404 of the circuit pattern portion 200.

Due to the lengths of the through vias 120a, 120b, 120c, and 120d and the thicknesses of the dielectric members 130a, 130b, 130c, and 130d, the boundary conditions for an operation of transmitting and receiving the RF signals of the corresponding first and second antenna members may be freely designed. Accordingly, the through vias 120a, 120b, 120c, and 120d and the dielectric members 130a, 130b, 130c, and 130d have boundary conditions (e.g., a small manufacturing tolerance, a short electrical length, a smooth surface, a large size of the cavity, and a low dielectric constant, as non-limiting examples) suitable for the operation of transmitting and receiving RF signals of the corresponding first antenna members 115a, 115b, 115c, and 115d and second antenna members 110a, 110b, 110c, and 110d, such that the antenna performance of the first antenna members 115a, 115b, 115c, and 115d and the second antenna members 110a, 110b, 110c, and 110d is improved.

For example, the dielectric members 130a, 130b, 130c, and 130d may be formed of a material having a dielectric dissipation factor (Df) such as quartz or teflon and/or a material having a low specific dielectric constant (Dk). Thus, the antenna performance of the corresponding first antenna members 115a, 115b, 115c, and 115d and second antenna members 110a, 110b, 110c, and 110d is further improved.

The insulating member 140 may have a thickness similar to the thickness of the dielectric members 130a, 130b, 130c, and 130d. For example, the insulating member 140 is formed of the same material as that of the insulating layer 204 of the circuit pattern portion 200, and may be implemented as a copper clad laminate (CCL).

The encapsulation member 150 surrounds the second antenna members 110a, 110b, 110c, and 110d and is inserted into a gap between the dielectric members 130a, 130b, 130c, and 130d and the insulating member 140. That is, the encapsulation member 150 improves the stability of the antenna portion 100.

The plating members 161 and 165 are disposed between the dielectric members 130a, 130b, 130c, and 130d and the insulating member 140.

The plating members 161 and 165 provide the boundary conditions suitable for the operation of transmitting and receiving the RF signals of the first antenna members 115a, 115b, 115c, and 115d and the second antenna members 110a, 110b, 110c, and 110d, and improve isolation between the cavities, such that the antenna performance of the first antenna members 115a, 115b, 115c, and 115d and the second antenna members 110a, 110b, 110c, and 110d is 110a, 110b, 110c, and 110d is improved.

The shielding vias 162, 163, and 164 are disposed between the dielectric members 130a, 130b, 130c, and 130d. The shielding vias 162, 163, and 164 are disposed to two-dimensionally surround or partially surround each of the cavities together along with the plating members 161 and 165.

The plating members 161 and 165 and the shielding vias 162, 163, and 164 provide the boundary conditions suitable for the operation of transmitting and receiving the RF signals of each of the corresponding first antenna members 115a, 115b, 115c, and 115d and second antenna members 110a, 110b, 110c, and 110d, and further improve the isolation between the cavities, such that the antenna performance of the corresponding first antenna members 115a, 115b, 115c, and 115d and second antenna members 110a, 110b, 110c, and 110d is improved.

The circuit pattern portion 200 provides an electrical connection path to the IC 300 of each of the through vias 120a, 120b, 120c, and 120d. That is, the through vias 120a, 120b, 120c, and 120d are respectively connected to the first antenna members 115a, 115b, 115c, and 115d, and are connected to the at least one circuit pattern 202 to provide respective linear electrical connection paths between the through vias 120a, 120b, 120c, and 120d and the at least one circuit pattern 202. In addition, the circuit pattern portion 200 may provide a ground region and/or a power supply region that supports the IC 300, and may provide an electrical connection path between sub-substrates 400a and 400b and the IC 300.

For example, the circuit pattern portion 200 has a structure similar to a copper redistribution layer (RDL) of a printed circuit board (PCB). On the other hand, the specific form of the circuit pattern 202 in the circuit pattern portion 200 is not limited to the form shown in FIG. 1. For example, the circuit pattern 202 includes feeding lines that are electrically isolated from each other and electrically connect the corresponding through vias to the IC 300.

Referring to FIG. 1, at least some of the IC 300, solder balls 310, a resin 320, electronic components 350a and 350b, and the sub-substrates 400a and 400b are disposed on a second surface (lower surface in FIG. 1) of the antenna module 10. That is, at least some of the IC 300, solder balls 310, a resin 320, electronic components 350a and 350b, and the sub-substrates 400a and 400b are disposed on a lower surface of the circuit pattern portion 200.

The IC 300 may generates the RF signals and receives the RF signals received through the second antenna members 110a, 110b, 110c, and 110d. For example, the IC 300 receives a low frequency signal through the sub-substrates 400a and 400b, and performs any one or any combination of any two or more of frequency conversion, amplification, filtering phase control, and power generation on the low frequency signal and converts the low frequency signal into the RF signal in a millimeter wave (mmWave) band.

The solder balls 310 electrically connect the IC 300 to the circuit patterns 202 of the circuit pattern portion 200 and electrically connect the circuit patterns 202 to the sub-substrates 400a and 400b.

The resin 320 improves the disposition stability for the second surface (lower surface in FIG. 1) of the antenna module of the IC 300.

The electronic components 350a and 350b provide any one or any combination of any two or more of a resistance value, a capacitance, and an inductance to the IC 300. For example, the electronic components 350a and 350b may include a multilayer ceramic capacitor (MLCC).

The sub-substrates 400a and 400b receive a low frequency signal and/or a power, transmit the low frequency signal and/or the power to the IC 300, and are electrically connected to the circuit patterns 202 of the circuit pattern region 200 by solder balls 310.

For example, the sub-substrates 400a and 400b include at least one circuit pattern 410a and at least one circuit pattern 410b, respectively, at least one insulating layer 420a and at least one insulating layer 420b, respectively, and external connection solder balls 430a and 430b, respectively.

Figure 2:
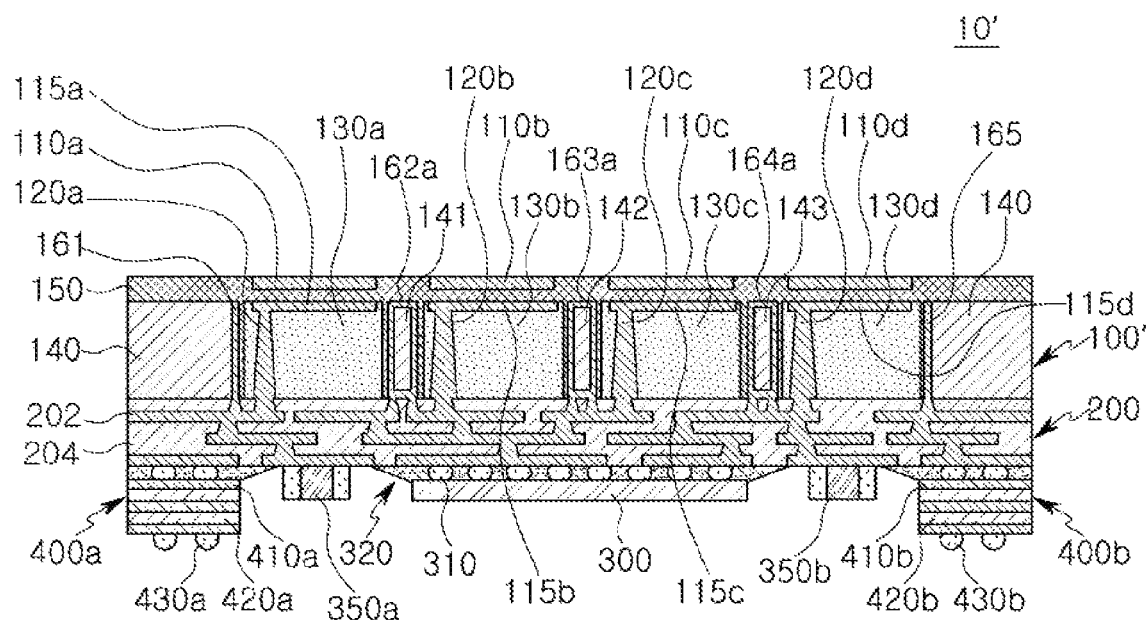
FIG. 2 is a diagram illustrating an antenna module having a plating structure corresponding to each of first antennas therein, according to an embodiment.

FIG. 2 is a diagram showing an antenna module 10' including a plating structure corresponding to each of the first antennas 115a, 115b, 115c, and 115d.

Referring to FIG. 2, the antenna portion 100' includes the insulating member 140 and second to fourth insulating members 141, 142, and 143. The second to fourth insulating members 141, 142, and 143 are surrounded or partially surrounded by corresponding plating members 162a, 163a, and 164a.

That is, the insulating member 140 and the second insulating member 141 may surround or partially surround a first cavity two-dimensionally, the second insulating member 141 and the third insulating member 142 may surround or partially surround a second cavity two-dimensionally, the third insulating member 142 and the fourth insulating member 143 may surround or partially surround a third cavity two-dimensionally, and the fourth insulating member 143 and the insulating member 140 may surround or partially surround a fourth cavity two-dimensionally. In this example, the plating members 161, 162a, 163a, 164a, and 165 may surround or partially surround each of the first to fourth cavities two-dimensionally.

Figure 3:
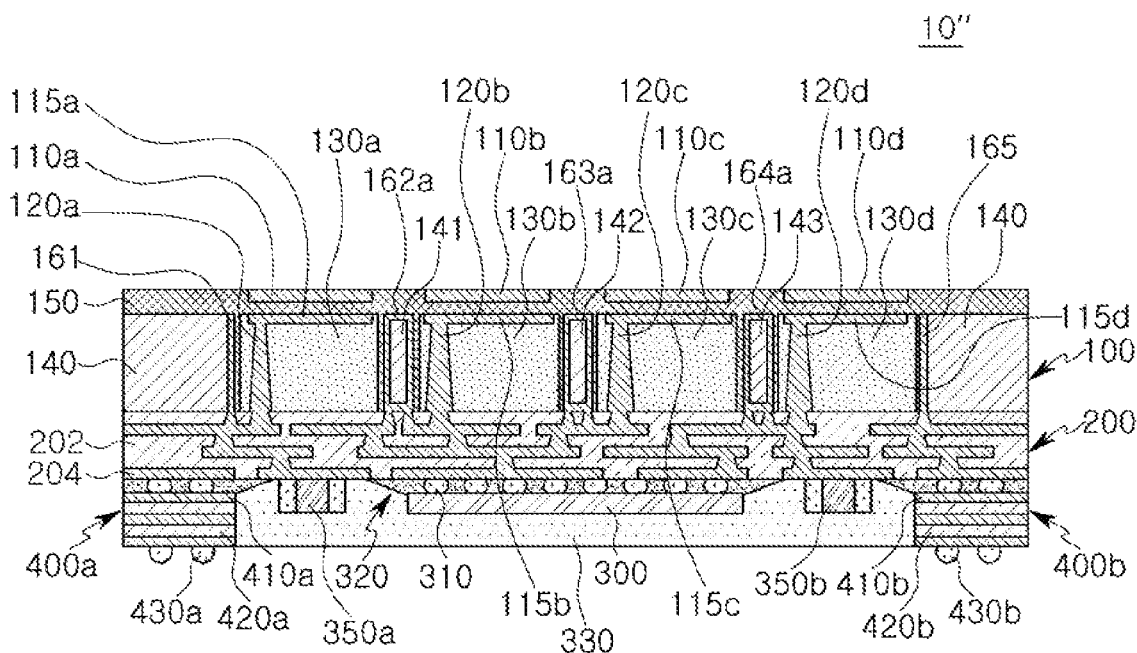
FIG. 3 is a diagram illustrating an antenna module including a molding member for an IC, according to an embodiment.

FIG. 3 is a diagram showing an antenna module 10" including a molding member 300 for the IC 300.

Referring to FIG. 3, in the antenna module 10", the IC 300 and the electronic components 350a and 350b are at least partially covered or surrounded by a molding member 330 to protect the IC 300 and the electronic components 350a and 350b from the external environment. The molding member 330 may be formed of an epoxy molding compound.

Figure 4:
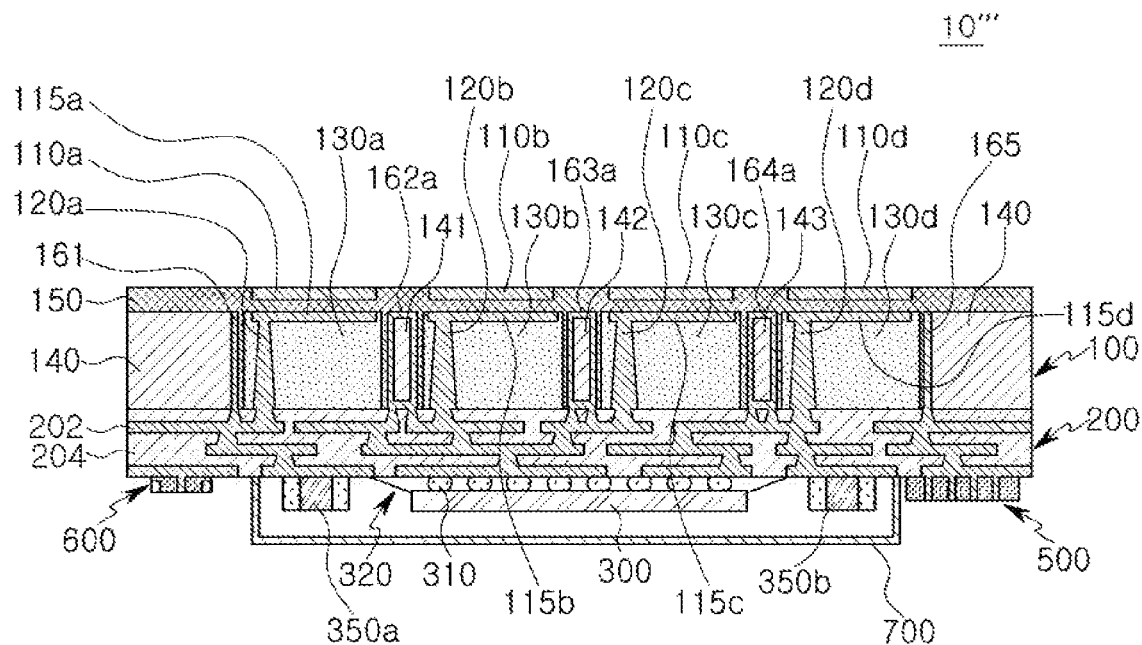
FIG. 4 is a diagram illustrating an antenna module including a connector, a receiving port and a shielding structure, according to an embodiment.

FIG. 4 is a diagram showing an antenna module 10''' including a connector 500, a receiving port 600 and a shielding can 700.

Referring to FIG. 4, the connector 500 may be configured to be coupled to an outside component, another module, or another substrate in a wired manner.

The receiving port 600 may also be configured to be electromagnetically coupled to an outside component, another module, or another substrate, and may receive a low frequency signal and/or a power and transmit the low frequency signal and/or the power to the IC 300.

A shielding can 700 surrounds the IC 300 to protect the IC 300 from external noise.

FIGS. 5A through 5J are diagrams showing a method of manufacturing the antenna module 10', according to an embodiment.

Figure 5A:
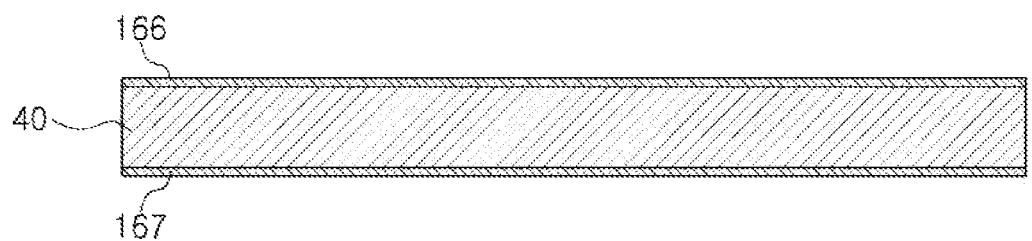
FIGS. 5A through 5J are diagrams illustrating a method of manufacturing the antenna module of FIG. 2, according to an embodiment.
Figure 5B:
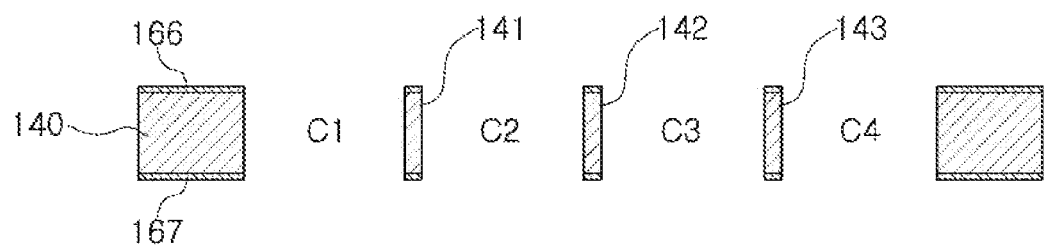

Referring to FIGS. 5A and 5B, first, the insulating sheet 40 and copper foil layers 166 and 167 disposed on upper and lower surfaces thereof is cut to form the insulating member 140 and the second through fourth insulating members 141, 142, and 143 to form cavities C1, C2, C3, and C4. However, in a manufacturing process of the antenna module 10 shown in FIG. 1, the second to fourth insulating members 141, 142, and 143 are omitted.

Figure 5C:
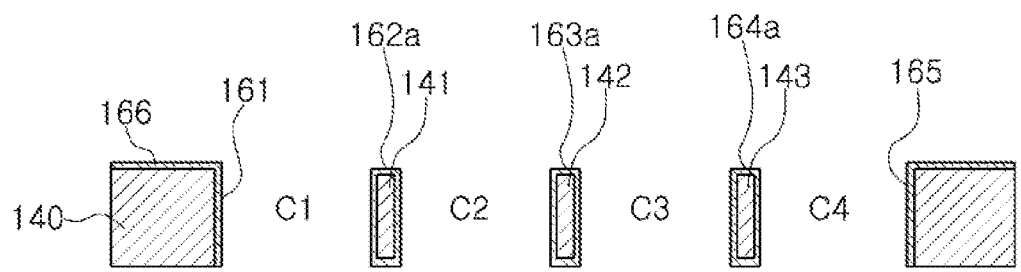

The cavities C1, C2, C3, and C4 are provided with the plating members 161, 162a, 163a, 164a, and 165, respectively, as shown in FIG. 5C. The plating members 161, 162a, 163a, 164a, and 165 are disposed on the insulating members 140, 141, 142, and 143, respectively. In the manufacturing process of the antenna module 10 shown in FIG. 1, the insulating members 162a, 163a, and 164a corresponding to the second to fourth insulating members 141, 142, and 143 are omitted.

Figure 5D:
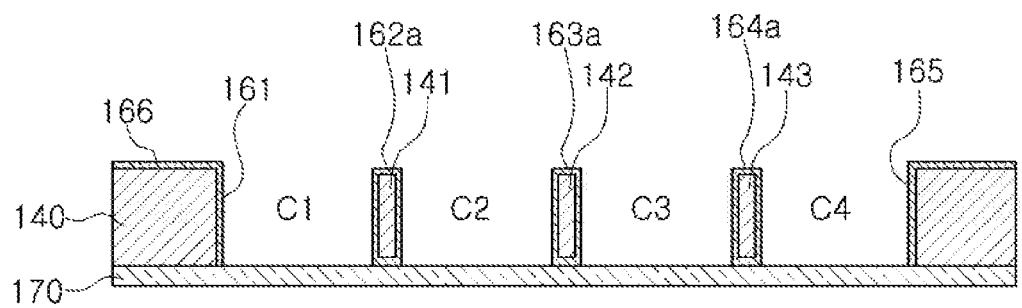

Referring to FIG. 5D, an adhesive member 170 is applied to the insulating member 140.

Figure 5E:
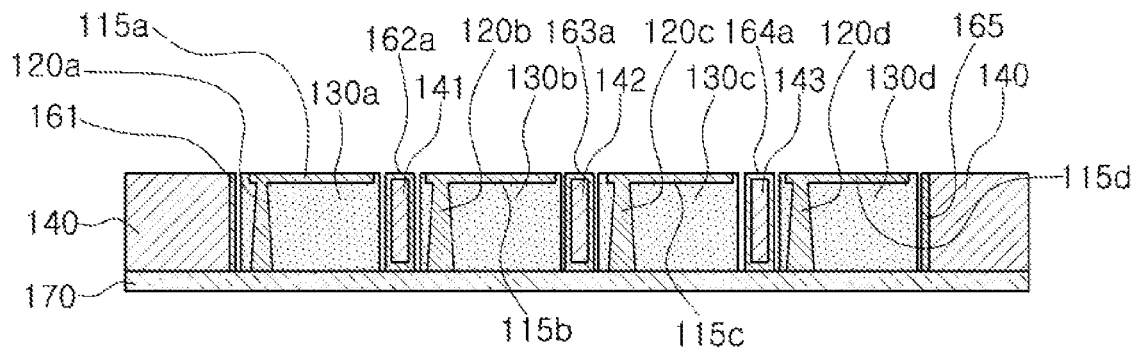

Referring to FIG. 5E, the first antenna members 115a, 115b, 115c, and 115d, the through vias 120a, 120b, 120c, and 120d, and the dielectric members 130a, 130b, 130c, and 130d are disposed in the respective cavities C1, C2, C3, and C4. In the manufacturing process of the antenna module 10 shown in FIG. 1, the shielding vias 162, 163, and 164 are arranged to penetrate the corresponding dielectric members 130a, 130b, 130c, and 130d.

Figure 5F:
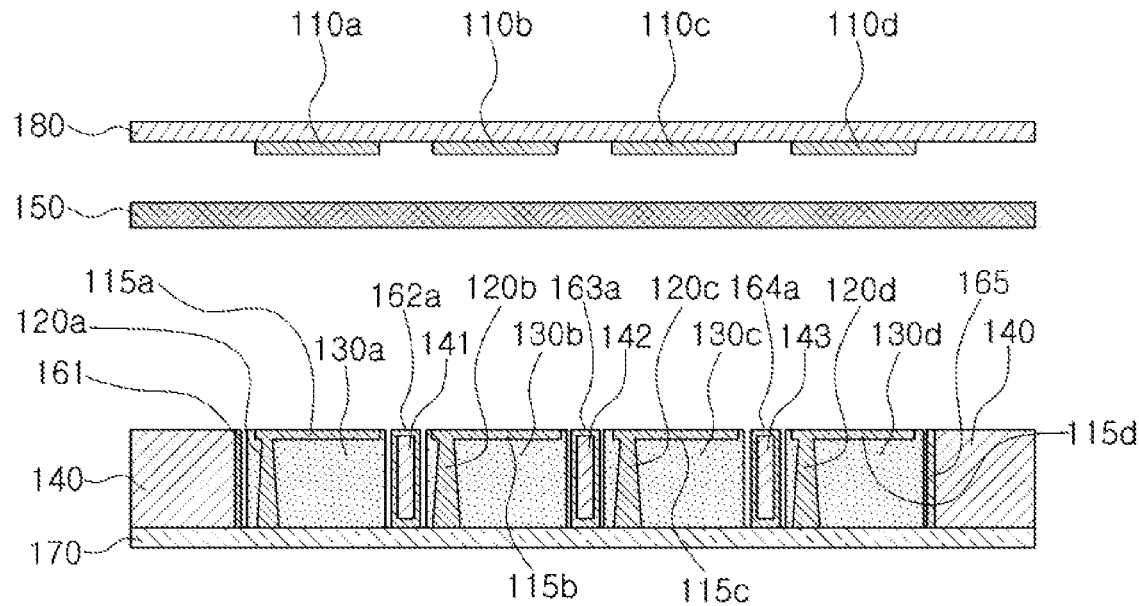
Figure 5G:
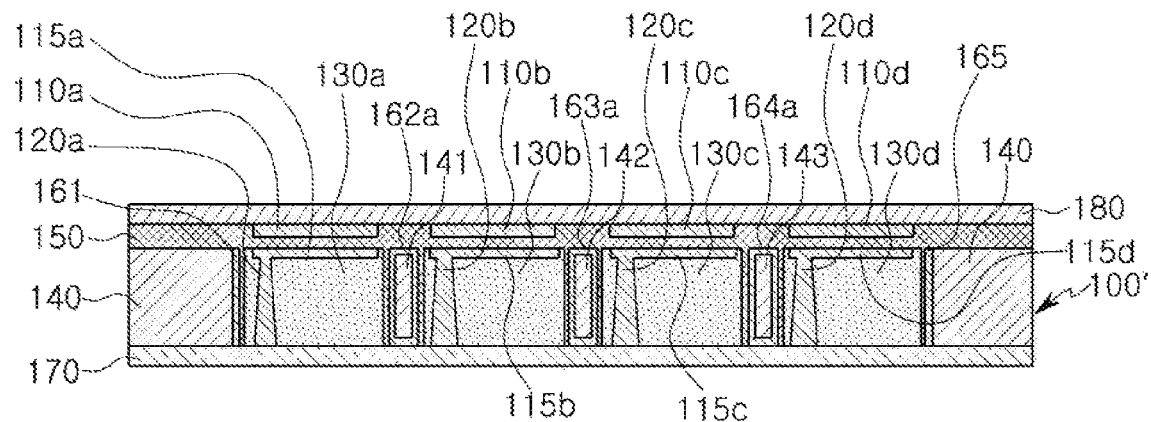

Referring to FIG. 5F, a film 180, including the second antenna members 110a, 110b, 110c, and 110d attached to a lower surface thereof, and the encapsulation member 150 are stacked on upper surfaces of the insulating layers 140, 141, 142, and 143, the first antenna members 115a, 115b, 115c, and 115d, and the dielectric members 130a, 130b, 130c, and 130d. Referring to FIG. 5G, the insulating member 140, the encapsulation member 150, the second antenna members 110a, 110b, 110c, and 110d, and the film 180 are then compressed such that the second antenna members 110a, 110b, 110c, and 110d are pressed into the encapsulation member 150, thereby forming the antenna portion 100'. In this example, a laminating method of a fan out panel level package (FOPLP) technology may be utilized.

Figure 5H:
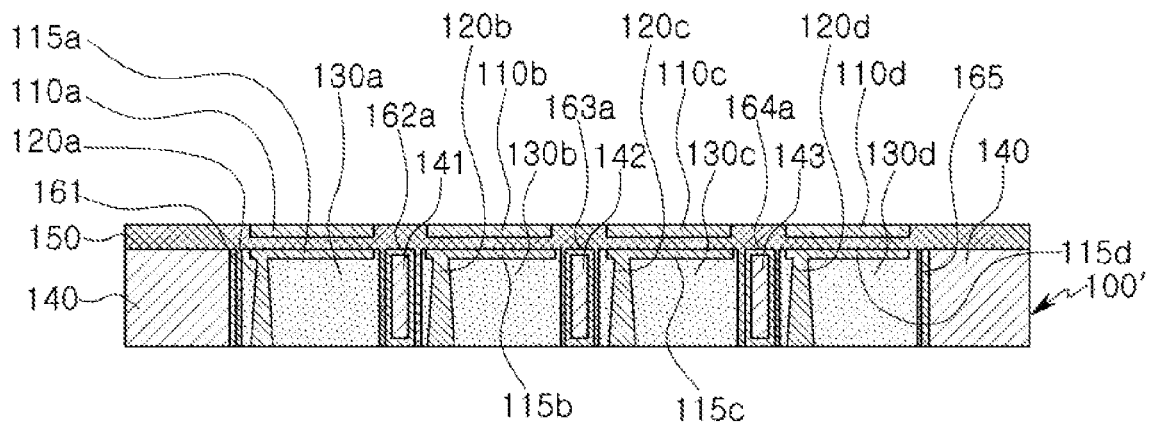

Next, as shown in FIG. 5H, film 180 is removed.

Figure 5I:
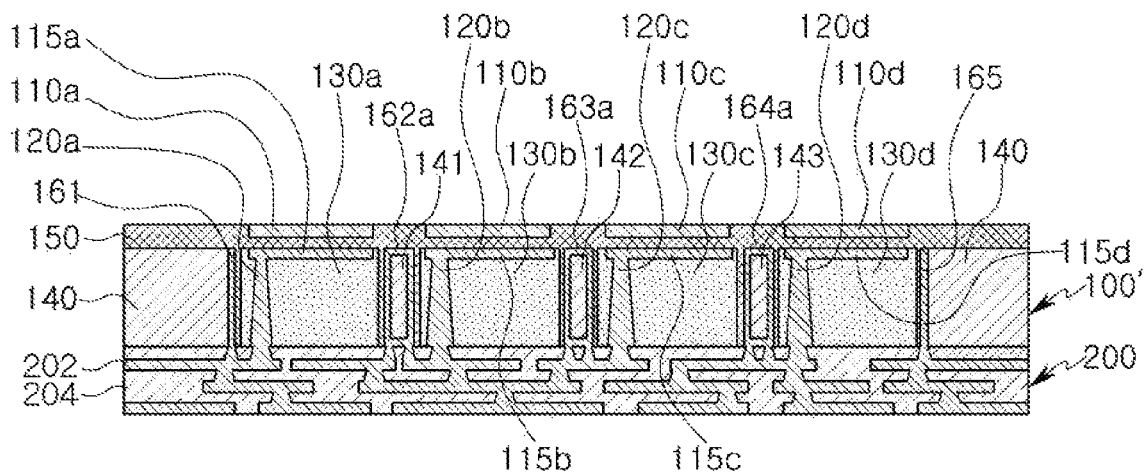

As shown in FIG. 5I, the adhesive member 170 is removed from the lower surface of the antenna portion 100', and the circuit pattern portion 200 is attached to the lower surface of the antenna portion 100'. In this example, a circuit redistribution layer (RDL) may be formed by the FOPLP technology.

Figure 5J:
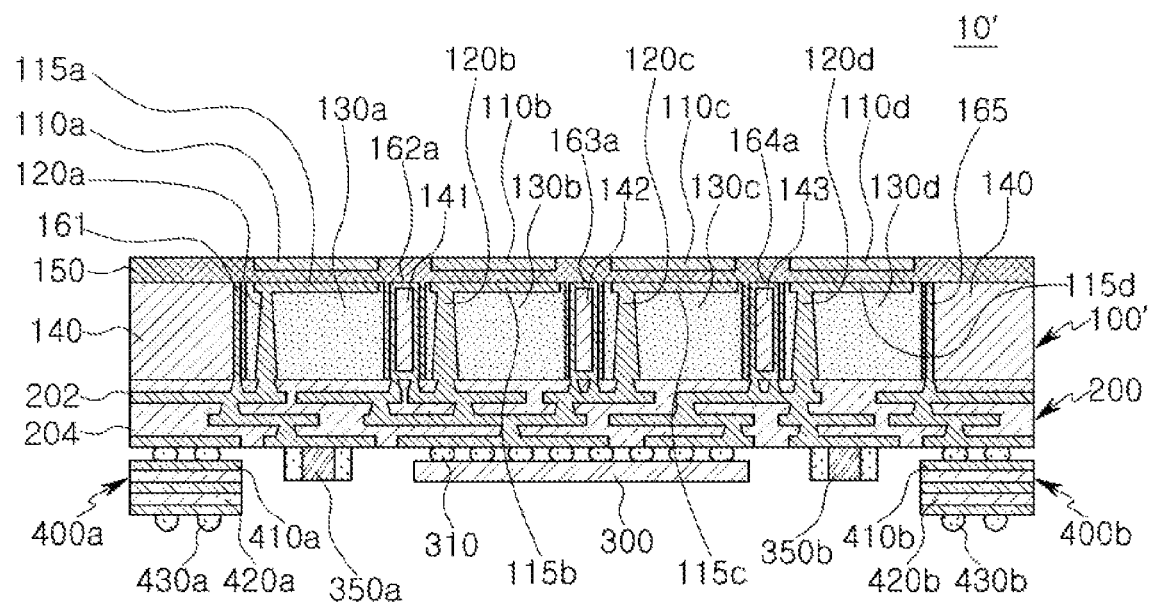

As shown in FIG. 5J, the circuit pattern portion 200 shown in FIG. 5I is provided with the solder balls 310, the IC 300, the electronic component 350, and the sub-substrates 400a and 400b. The solder balls 310 are applied with the resin 320 (FIG. 2).

Figure 6:
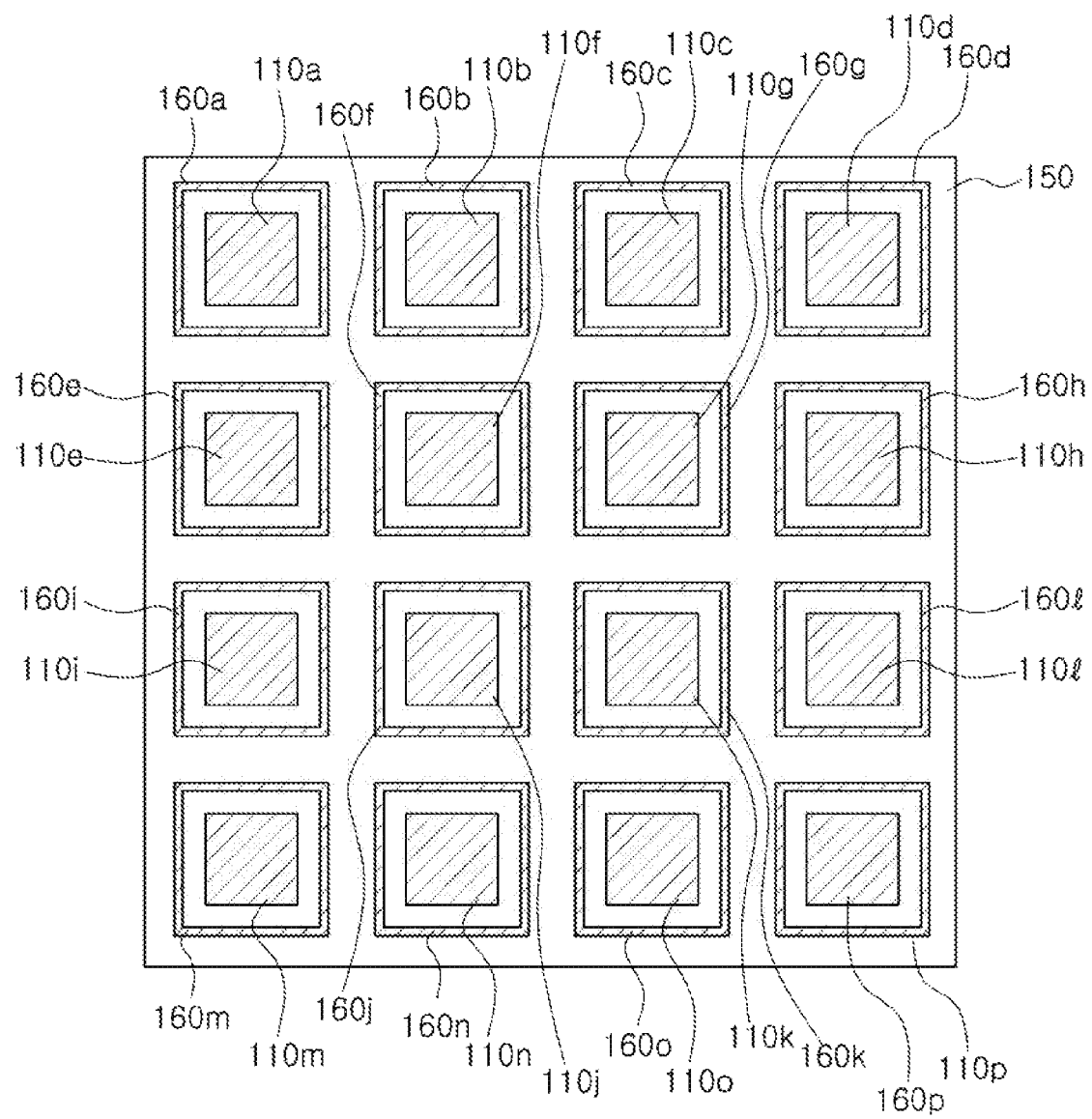
FIG. 6 is a diagram illustrating a first surface of the antenna module of FIG. 2.

FIG. 6 is a diagram showing a first surface of the antenna module 10' shown in FIG. 2.

Referring to FIG. 6, each of the second antenna members 110a, 110b, 110c, 110d, 110e, 110f, 110g, 110h, 110i, 110j, 110k, 110l, 110m, 110n, 110o, and 110p is surrounded by corresponding plating members 160a, 160b, 160c, 160d, 160e, 160f, 160g, 160h, 160i, 160j, 160k, 160l, 160m, 160n, 160o, and 160p. The plating members 160a, 160b, 160c, 160d, 160e, 160f, 160g, 160h, 160i, 160j, 160k, 160l, 160m, 160n, 160o, and 160p provide the boundary conditions suitable for the operation of transmitting and receiving the RF signals of the corresponding second antenna members 110a, 110b, 110c, 110d, 110e, 110f, 110g, 110h, 110i, 110j, 110k, 110l, 110m, 110n, 110o, and 110p, such that the antenna performance of the corresponding second antenna members is improved.

Figure 7:
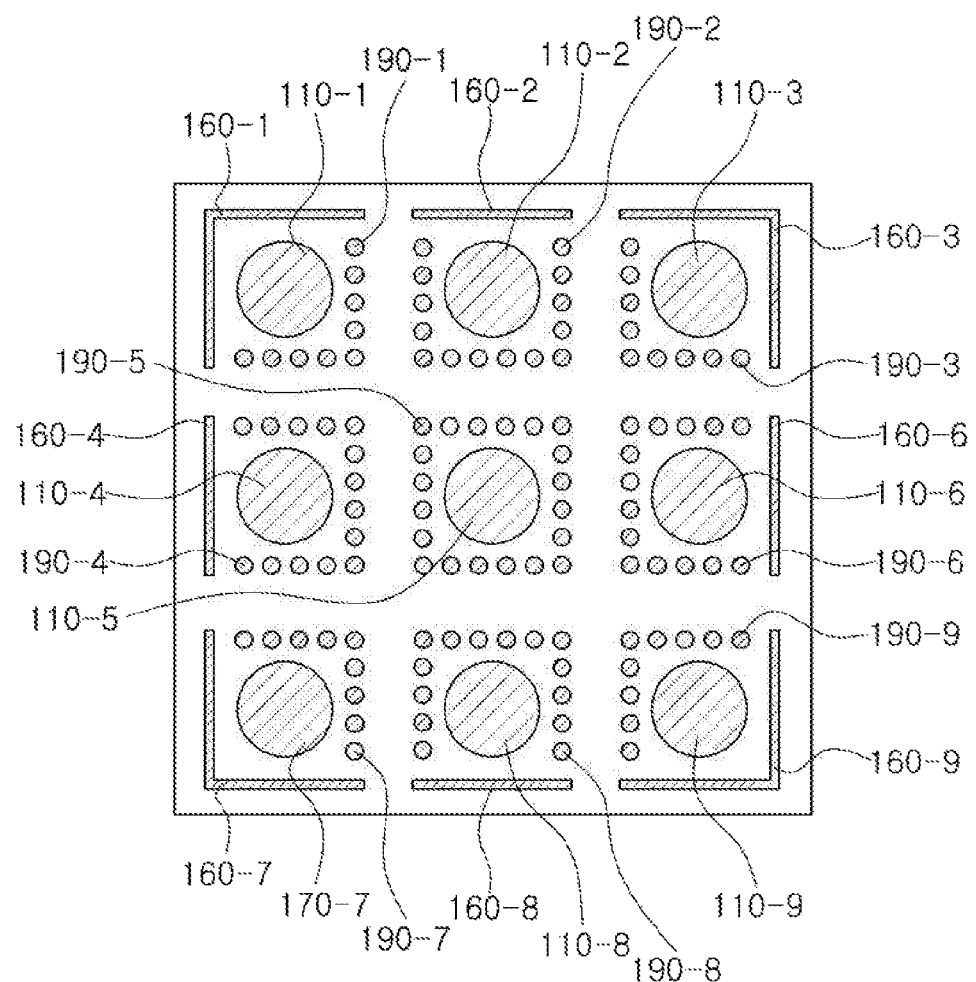
FIG. 7 is a diagram illustrating a first surface of an antenna module, according to another embodiment.

FIG. 7 is a diagram showing the first surface of an antenna module, according to another embodiment.

Referring to FIG. 7, second antenna members 110-1, 110-2, 110-3, 110-4, 110-5, 110-6, 110-7, 110-8, and 110-9 are surrounded by at least one corresponding plating member and at least one corresponding shielding via. That is, plating members 160-1, 160-2, 160-3, 160-4, 160-6, 160-7, 160-8, and 160-9 and of shielding vias 190-1, 190-2, 190-3, 190-4, 190-5, 190-6, 190-7, 190-8, and 190-9 provide the boundary conditions suitable for the operation of transmitting and receiving the RF signals of the corresponding second antenna members 110-1, 110-2, 110-3, 110-4, 110-5, 110-6, 110-7, 110-8, and 110-9, such that the antenna performance of the corresponding second antenna members 110-1, 110-2, 110-3, 110-4, 110-5, 110-6, 110-7, 110-8, and 110-9 is improved.

The plating members 160-1, 160-2, 160-3, 160-4, 160-6, 160-7, 160-8, and 160-9 may more completely surround the corresponding second antenna members 110-1, 110-2, 110-3, 110-4, 110-5, 110-6, 110-7, 110-8, and 110-9 than the shielding vias 190-1, 190-2, 190-3, 190-4, 190-5, 190-6, 190-7, 190-8, and 190-9. That is, the performance of a second antenna member completely surrounded by a plating member may be better than that of a second antenna member surrounded by a shielding via.

A process of forming the shielding via may be simpler than a process of forming the plating member. Accordingly, a plating member and a shielding via may be appropriately selected according to the performance and cost required for the antenna module.

A number, a disposition, and a shape of the second antenna members shown in FIGS. 6 and 7 is not particularly limited. For example, the shape of the plurality of second antenna members shown in FIG. 6 may be circular, and the number of second antenna members shown in FIG. 7 may be four.

When the second antenna members are omitted in an antenna module according to FIGS. 6 and 7, the second antenna members may be replaced with the first antenna members (e.g., the first antenna members 115a, 115b, 115c, and 115d shown in FIGS. 1-4).

Figure 8:
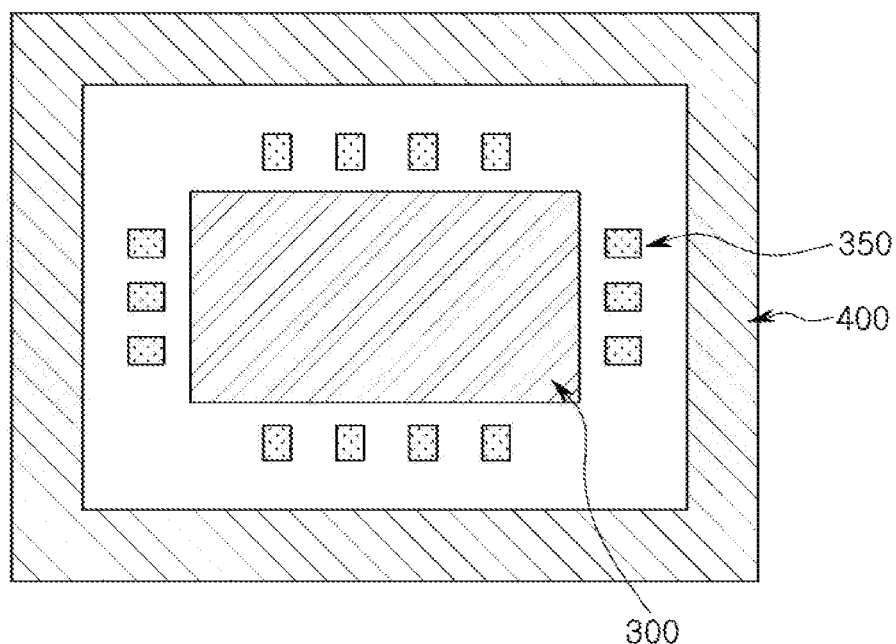
FIG. 8 is a diagram illustrating a second surface of an antenna module of FIG. 7, according to an embodiment.

FIG. 8 is a diagram showing a second surface of an antenna module, according to an embodiment.

Referring to FIG. 8, the IC 300 and electronic components 350 are surrounded by a sub-substrate 400. The electronic components may include the electronic components 350a and 350b shown in FIGS. 1 through 4, and the sub-substrate 400 may include the sub-substrates 400a and 400b shown in FIGS. 1 through 4.

As set forth above, according to embodiments disclosed herein, an antenna module and a method of manufacturing the antenna module improve the degree of freedom of the boundary conditions that the cavities provide to the plurality of antennas, and improve a degree of isolation between the cavities, thereby improving the antenna performance.

In addition, the disclosed antenna module and method of manufacturing the antenna module provide a structure that is easily miniaturized while having the high level of antenna performance, by using a substrate having an antenna portion facilitating improvement of the antenna performance and a circuit pattern portion facilitating formation of the circuit pattern.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module, comprising:
   an integrated circuit (IC) configured to generate a radio frequency (RF) signal; and
   a substrate comprising an antenna portion providing a first surface of the substrate, and a circuit pattern portion providing a second surface of the substrate,
   wherein the antenna portion comprises coplanar first antenna members configured to transmit the RF signal, cavities corresponding to the first antenna members, through vias respectively disposed in the cavities and respectively electrically connected to the first antenna members, dielectric members disposed in the cavities adjacent to corresponding through vias among the through vias, and plating members at least partially surrounding the dielectric members,
   wherein the circuit pattern portion comprises a circuit pattern and an insulating layer forming, for each of the through vias, an electrical connection path to the IC, and
   wherein the antenna portion further comprises an insulating member two-dimensionally surrounding each of the cavities, and a thickness of the insulating member is greater than a thickness of the insulating layer of the antenna module.

2. The antenna module of claim 1, wherein the through vias form linear connections between the circuit pattern portion and corresponding first antenna members among the first antenna members.

3. The antenna module of claim 1, wherein the plating members two-dimensionally surround each of the cavities.

4. The antenna module of claim 1, wherein the antenna portion further comprises shielding vias at least partially two-dimensionally surrounding each of the cavities along with the plating members.

5. The antenna module of claim 1,
   wherein the dielectric members at least partially two-dimensionally surround the corresponding through vias, and
   wherein a dielectric constant of the dielectric members is different from a dielectric constant of the insulating layer.

6. The antenna module of claim 5, wherein a dielectric dissipation factor (Df) of the dielectric members is lower than a Df of the insulating layer, and
   the dielectric constant of the dielectric members has a specific dielectric constant (Dk) which is lower than a Dk of the dielectric constant of the insulating layer.

7. The antenna module of claim 1, wherein
   the first antenna members are disposed in the corresponding cavities, and
   the antenna portion further comprises second antenna members corresponding to the first antenna members, and an encapsulation member at least partially two-dimensionally surrounding the second antenna members and forming the first surface.

8. The antenna module of claim 1, wherein the IC is configured to convert a signal received through a connector or a receiving port disposed on the second surface into the RF signal in a millimeter wave (mmWave) band.

9. The antenna module of claim 1, wherein the dielectric members are formed of teflon.

10. An antenna module, comprising:
an integrated circuit (IC) configured to generate a radio frequency (RF) signal; and
a substrate comprising an antenna portion providing a first surface of the substrate, and a circuit pattern portion providing a second surface of the substrate,
wherein the antenna portion comprises coplanar first antenna members configured to transmit the RF signal, cavities corresponding to the first antenna members, through vias respectively disposed in the cavities and respectively electrically connected to the first antenna members, dielectric members disposed in the cavities adjacent to corresponding through vias among the through vias, and plating members at least partially surrounding the dielectric members, and
wherein the circuit pattern portion comprises a circuit pattern and an insulating layer forming, for each of the through vias, an electrical connection path to the IC;
the antenna module further comprising an insulating member two-dimensionally surrounding the dielectric members, wherein a dielectric constant of the dielectric members is different from a dielectric constant of the insulating member.

11. The antenna module of claim 10, wherein the dielectric members are formed of teflon.

12. The antenna module of claim 10, wherein a thickness of the insulating member is greater than a thickness of the insulating layer of the antenna module.

13. The antenna module of claim 12, wherein the through vias form linear connections between the circuit pattern portion and corresponding first antenna members among the first antenna members.

14. The antenna module of claim 10, wherein the plating members two-dimensionally surround each of the cavities.

15. The antenna module of claim 10, wherein the antenna portion further comprises shielding vias at least partially two-dimensionally surrounding each of the cavities along with the plating members.

16. The antenna module of claim 10, wherein the dielectric members at least partially two-dimensionally surround the corresponding through vias, and
wherein the dielectric constant of the dielectric members is different from a dielectric constant of the insulating layer.

17. The antenna module of claim 16, wherein a dielectric dissipation factor (Df) of the dielectric members is lower than a Df of the insulating layer, and
the dielectric constant of the dielectric members has a specific dielectric constant (Dk) which is lower than a Dk of the dielectric constant of the insulating layer.

18. The antenna module of claim 10, wherein the first antenna members are disposed in the corresponding cavities, and
wherein the antenna portion further comprises second antenna members corresponding to the first antenna members, and an encapsulation member at least partially two-dimensionally surrounding the second antenna members and forming the first surface.

19. The antenna module of claim 10, wherein the IC is configured to convert a signal received through a connector or a receiving port disposed on the second surface into the RF signal in a millimeter wave (mmWave) band.

* * * * *